United States Patent
Kim et al.

(10) Patent No.: US 9,548,772 B2
(45) Date of Patent: Jan. 17, 2017

(54) APPARATUS AND METHOD FOR CONTROLLING GAIN IN COMMUNICATION SYSTEM

(71) Applicants: Do-Yun Kim, Gyeonggi-do (KR); Young-Ik Cho, Seoul (KR); Jeong-Soon Park, Seoul (KR); Beom-Kon Kim, Seoul (KR)

(72) Inventors: Do-Yun Kim, Gyeonggi-do (KR); Young-Ik Cho, Seoul (KR); Jeong-Soon Park, Seoul (KR); Beom-Kon Kim, Seoul (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/849,111

(22) Filed: Sep. 9, 2015

(65) Prior Publication Data
US 2016/0173146 A1    Jun. 16, 2016

(30) Foreign Application Priority Data
Dec. 10, 2014   (KR) .................. 10-2014-0177727

(51) Int. Cl.
| H04B 1/06 | (2006.01) |
| H04B 1/04 | (2006.01) |
| H04W 52/52 | (2009.01) |
| H04B 7/00 | (2006.01) |

(52) U.S. Cl.
CPC .......... *H04B 1/0475* (2013.01); *H04W 52/52* (2013.01); *H04B 2001/0416* (2013.01)

(58) Field of Classification Search
CPC ........... H03G 3/20; H03G 3/30; H03G 3/301; H03G 3/3026; H03G 3/3052
USPC .......................................... 455/232.1–250.1
See application file for complete search history.

(56) References Cited

U.S. PATENT DOCUMENTS

| | | | |
|---|---|---|---|
| 5,301,364 A | 4/1994 | Arens et al. | |
| 6,563,891 B1 | 5/2003 | Eriksson et al. | |
| 6,975,449 B1 | 12/2005 | Mok et al. | |
| 7,039,378 B2 | 5/2006 | Yang et al. | |
| 7,148,749 B2 | 12/2006 | Rahman et al. | |
| 7,197,289 B2 | 3/2007 | Zeira et al. | |
| 7,592,863 B2 | 9/2009 | Elwan et al. | |
| 7,684,524 B2 | 3/2010 | Haim et al. | |
| 7,911,985 B2 | 3/2011 | Proctor, Jr. et al. | |
| 2002/0054583 A1* | 5/2002 | Olesen ................ | H03G 3/3078 370/336 |

(Continued)

FOREIGN PATENT DOCUMENTS

| KR | 1995-0009559 | 8/1995 |
|---|---|---|
| KR | 10-0526417 | 10/2005 |

(Continued)

*Primary Examiner* — Lee Nguyen
(74) *Attorney, Agent, or Firm* — The Farrell Law Firm, P.C.

(57) ABSTRACT

A method and a terminal are provided for use in a communication system. The method includes determining an average power from power obtained in a measurement section of a data symbol in a time slot including an updated gain section and a maintained gain section, the measurement section starting after a last gain is applied in the data symbol and ending before a mid-amble of the time slot is buffered, determining an average error power from a difference between a predetermined target power and the average power, and determining an output power by adding the average error power to power that is received over the time slot.

20 Claims, 9 Drawing Sheets

(56) References Cited

U.S. PATENT DOCUMENTS

2003/0026363 A1   2/2003   Stoter et al.
2004/0242172 A1  12/2004   Haim et al.

FOREIGN PATENT DOCUMENTS

KR    10-2005-0114657    12/2005
KR       10-0897414       5/2009

* cited by examiner

APPARATUS AND METHOD FOR CONTROLLING GAIN IN COMMUNICATION SYSTEM

PRIORITY

This application claims priority under 35 U.S.C. §119(a) to Korean Application Serial No. 10-2014-0177727, which was filed in the Korean Intellectual Property Office on Dec. 10, 2014, the entire content of which is incorporated herein by reference.

BACKGROUND

1. Field of the Disclosure

The present disclosure relates generally to a method for controlling gain in a communication system.

2. Description of the Related Art

In Time Division Synchronous Code Division Multiple Access (TD-SCDMA), a plurality of subscribers execute communication in a single frequency using different time bands, unlike in Code Division Multiple Access (CDMA) or Wideband Code Division Multiple Access (WCDMA), which use multiple transmission/reception frequencies. TD-SCDMA is a Time Division Duplex (TDD) based mobile communication scheme, which transmits or receives a data block based on a time slot (TS). TD-SCDMA uses a mid-amble of a data block as a reference signal, and distinguishes a part of the data block before the reference signal and a part of the data block after the reference signal as Data-1 and Data-2, respectively.

In TD-SCDMA, reception power is different for each data block, and gain may be controlled to adjust a difference in reception powers. For example, a conventional technique, such as Automatic Gain Control (AGC) may be implemented as the gain control method.

A first AGC method executes gain estimation and gain control N times using Data-1, and fixes the last gain. In this method, when data allocation of a TS is executed first, the lowest gain is set as an initial value; otherwise, the last gain of a previous sub-frame is set as an initial value.

A second AGC method calculates an error based on an input power and a target power, and uses an algorithm that changes an AGC loop speed based on the calculated value. Specifically, when a signal is input in a gap section, an error value rapidly increases. The second AGC method increases the speed, based on the increased error value, in order to execute faster AGC. When the error value is adjusted within a predetermined range, the method executes slower AGC. Also, the gain initial value of the AGC is set to a previous convergence value of an error value stored in a memory, by which an AGC stabilization time may be reduced.

The above described first and second AGC methods correspond to AGC operations when a difference in reception powers is high among data blocks, in order to converge a signal on a target level after a predetermined period of time, which indicates that the gain used in a data block and a received signal level may have been different in the part before the reference signal, i.e., Data-1.

However, when a receiver, which is capable of securing high performance at a constant gain for each data block is assumed, the above-described conventional AGC methodologies may not overcome deterioration in performance. Therefore, when the difference in reception powers among blocks is high, there is a desire for a method that enables convergence of signals on a target level in order to overcome performance deterioration.

SUMMARY

An aspect of the present disclosure is to provide a method and an apparatus for controlling gain in a communication system.

Another aspect of the present disclosure is to provide a method and an apparatus for adjusting gain in a communication system.

Another aspect of the present disclosure is to provide a method and an apparatus in which a received signal is adjusted for an average error and arrives at a target power level.

Another aspect of the present disclosure is to provide a method and an apparatus in which gain adjustment reduces performance deterioration.

In accordance with an aspect of the present disclosure, a method of a terminal is provided, which includes determining an average power from power obtained in a measurement section of a data symbol in a time slot including an updated gain section and a maintained gain section, the measurement section starting after a last gain is applied in the data symbol and ending before a mid-amble of the time slot is buffered, determining an average error power from a difference between a predetermined target power and the average power, and determining an output power by adding the average error power to power that is received over the time slot.

In accordance with another aspect of the present disclosure, a terminal is provided, which includes terminal in a communication system, the terminal includes a transceiver configured to receive a signal; and a controller configured to determine an average power from power obtained in a measurement section of a data symbol in a time slot of the signal including an updated gain section and a maintained gain section, the measurement section starting after a last gain is applied in the data symbol and ending before a mid-amble of the time slot is buffered, determine an average error power from a difference between a predetermined target power and the average power, and determine an output power by adding the average error power to power that is received over the time slot.

In accordance with another aspect of the present disclosure, a chipset is provided, which is configured to determine an average power from power obtained in a measurement section of a data symbol in a time slot including an updated gain section and a maintained gain section, the measurement section starting after a last gain is applied in the data symbol and ending before a mid-amble of the time slot is buffered; determine an average error power from a difference between a predetermined target power and the average power; and determine an output power by adding the average error power to power that is received over the time slot.

BRIEF DESCRIPTION OF THE DRAWINGS

The above and other aspects, features, and advantages of certain embodiments of the present disclosure will be more apparent from the following detailed description taken in conjunction with the accompanying drawings, in which.

DETAILED DESCRIPTION

Various embodiments of the present disclosure will now be described in detail with reference to the accompanying drawings. In the following description, specific details such as detailed configuration and components are merely provided to assist the overall understanding of these embodiments of the present disclosure. Therefore, it should be apparent to those skilled in the art that various changes and modifications of the embodiments described herein can be made without departing from the scope and spirit of the present disclosure. In addition, descriptions of well-known functions and constructions are omitted for clarity and conciseness.

In detailed embodiments of the present disclosure, component elements included in the present disclosure may be expressed as a single entity or multiple entities, depending on a detailed embodiment. However, the expression of a single entity or multiple entities is selected to be appropriate for the given situation for the ease of description. The present disclosure should not be limited to a single component or multiple component elements, and a component element expressed as multiple entities may be configured as a single entity and a component element expressed as a single entity may be configured as multiple entities.

Hereinafter, various embodiments of the present disclosure are related to controlling gain, e.g., by a terminal. In the present disclosure, a terminal may include a mobile communication terminal such as a cellular phone and/or a smart phone. Also, although various embodiments of the present disclosure are described in relation to a TD-SCDMA system, the present disclosure is not limited thereto and may be applied to other systems.

Figure 1:
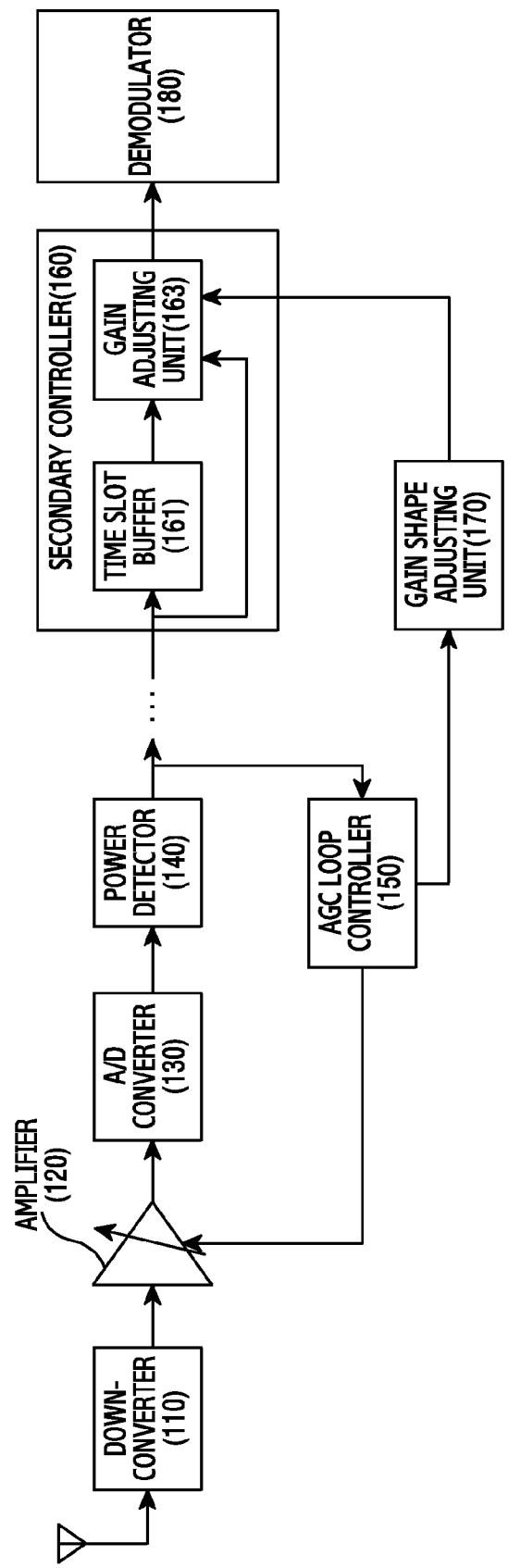
FIG. 1 illustrates an apparatus for adjusting gain according to an embodiment of the present disclosure.

FIG. 1 illustrates an apparatus for adjusting gain according to an embodiment of the present disclosure.

Referring to FIG. 1, the apparatus includes a down-converter 110, an amplifier 120, an analog-to-digital (A/D) converter 130, a power detector 140, an AGC loop controller 150, a secondary controller 160, a time slot buffer 161, a gain adjusting unit 163, a gain shape adjusting unit 170, and a demodulator 180.

The down-converter 110 converts an input frequency into a baseband, which is output to the amplifier 120. For example, the down-converter 110 converts a signal transmitted in a high frequency band into a baseband or a low frequency, in order to apply the same to a terminal having a low operation frequency of a level of a symbol rate.

The amplifier 120 increases energy of the signal received from the down-converter 110. In particular, the amplifier 120 may adjust a size of an analog signal using information fed back from the AGC loop controller 150.

The A/D converter 130 converts an analog signal received from the amplifier 120 into a digital signal.

The power detector 140 measures power of the digital signal received from the A/D converter 130. The power detector 140 may calculate power of a received signal during a desired section. For example, the power detector 140 may calculate power of a received signal based on Equation (1), as shown below.

$$P = \sum_M (I^2 + Q^2) \qquad (1)$$

In Equation (1), P represents the power of the received signal, I represents In-phase, Q represents Quadrature-phase, and M represents magnitude.

The AGC loop controller 150 determines a gain of the amplifier 120 based on a signal power calculated by the power detector 140. For example, the gain is determined such that the calculated signal power will not be outside the operation capabilities of the A/D converter 130

The secondary controller 160 includes the time slot buffer 161 and the gain adjusting unit 163. The time slot buffer 161 stores a signal received in real time, until the demodulator 180 receives a mid-amble and acquires information for decoding the mid-amble. The gain adjusting unit 163 receives, from the time slot buffer 161, a signal received in real time, and determines an average error power. The gain adjusting unit 163 receives a time slot output, and adjusts a gain for a value equivalent to a sum of an average error power and a gain difference, based on an initially determined sample unit.

The gain shape adjusting unit 170 adjusts the shape of the gain to correspond to the shape of a general filter impulse response between the amplifier 120 and the gain adjusting unit 163. For example, the gain shape adjusting unit 170 may remove discontinuous gain adjustment.

Figure 2:
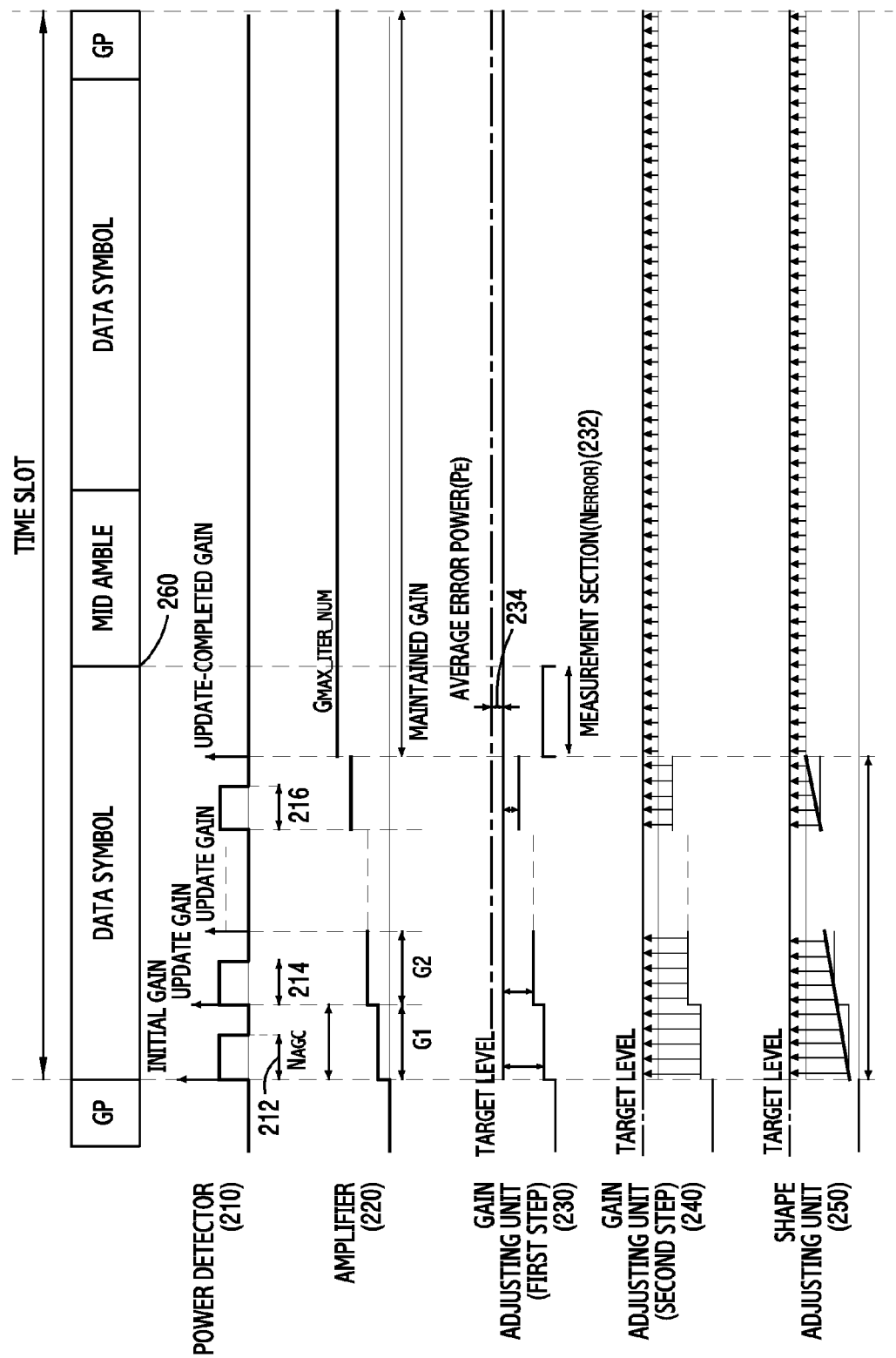
FIG. 2 illustrates an example of power detection and variations in gain adjustments according to an embodiment of the present disclosure.

FIG. 2 illustrates an example of power detection and variations in gain adjustments according to an embodiment of the present disclosure.

Referring to FIG. 2, a power detector 210, an amplifier 220, a gain adjusting unit 230 and 240, and a shape adjusting unit 250 detect power and perform gain adjustment. The power detector 210 measures power of a received signal during times ($N_{AGC}$) 212, 214, and 216, at which power is sensed, in an updated gain section of the timeslot. The measured signal is transferred to the gain adjusting unit 230 and 240. When the power detector 210 senses the changes in power at times 212, 214, and 216, an AGC loop controller, e.g., the AGC loop controller 150 as illustrated in FIG. 1, calculates a gain using a reception power. When the AGC loop controller transfers information associated with a calculated gain to the amplifier 220, the amplifier 220 may amplify a received signal based on a corresponding gain value.

The information associated with the gain value may be transferred to a time slot buffer and the gain adjusting unit 230 and 240. The gain adjusting unit 230 and 240, which receives a gain value, measures an average power of a predetermined section ($N_{ERROR}$) 232, and calculates an average error power 234 using a difference between a set target level and the average power of the predetermined section ($N_{ERROR}$) 232. The predetermined section ($N_{ERROR}$) 232 for calculating the average error power 234 may start at a point where gain updating of the last iteration (MAX_ITER_NUM) begins, i.e., the end of the updated gain section of the timeslot, and end at a starting point 260 of a mid-amble. For example, the average error power 234 may be determined based on Equation (2), as shown below.

$$Pe = \text{TargetLevel} - E_{Nerror} \qquad (2)$$

In Equation (2), Pe denotes an average error power, TargetLevel denotes a target power, and $E_{Nerror}$ denotes an average power in an $N_{ERROR}$ measurement section of a time slot. A default value of the target power may be determined based on a design of a modem, a Radio Frequency Integrated Circuit (RFIC), an Analog Digital Converter (ADC), etc., and may be changed based on a channel environment. The channel environment may be affected by such factors as the size of an interference signal, a required Signal to Noise Ratio (SNR) of received data, etc.

The terminal may adjust the shape of the gain, in addition to adjusting the gain. For example, the shape adjusting unit 250 may remove discontinuous gain to adjust the gain.

A constant gain that is applied in an amplifier passes through various filters until it arrives at a time slot buffer, and thus, when a gain adjusting unit block adjusts a gain through shape adjustment corresponding to all filter responses, more accurate gain adjustment may be executed with respect to all received signals. To this end, a shape adjusting unit may estimate an overall response of the filters through adjustment, and apply the value to the corresponding block using software.

Figure 3:
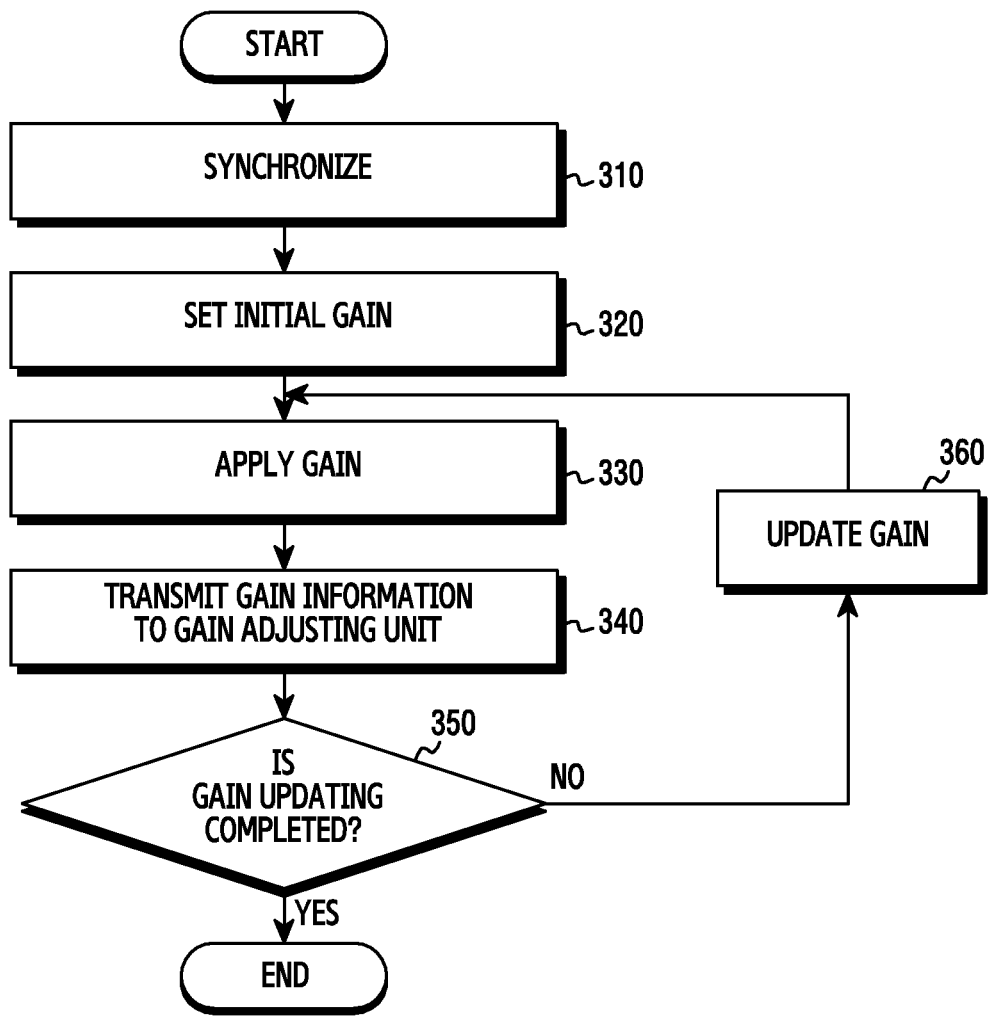
FIG. 3 illustrates a process of determining a maintained gain according to an embodiment of the present disclosure.

FIG. 3 illustrates a process of determining a maintained gain according to an embodiment of the present disclosure.

Referring to FIG. 3, a terminal performs synchronization with another device in step 310.

In step 320, an initial gain is set. For example, the terminal receives a signal from the another device, and sets the initial gain based on the power of the received signal.

In step 330, the terminal amplifies power by applying a gain based on the set initial gain.

In step 340, the terminal provides gain information to a gain adjusting unit.

In step 350, the terminal determines whether gain updating is completed. For example, the terminal may execute gain updating up to a predetermined number of times, and then terminates the gain updating, when the predetermined number of times of gain updating has been completed. If the predetermined number of times of gain updating have not been completed, the terminal updates the gain in operation 360, and re-performs steps 330, 340, and 350. For example, the number of updates may be set in advance or may be reset to an optimal value.

Figure 4:
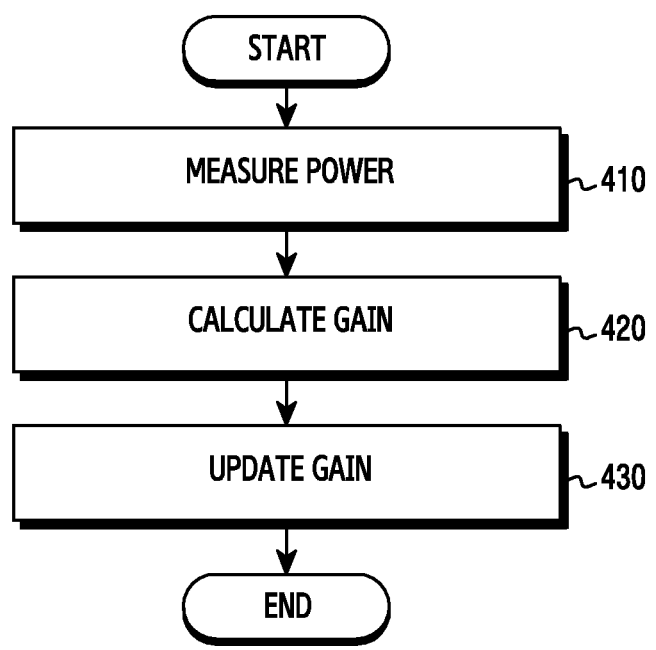
FIG. 4 illustrates a process of updating gain according to an embodiment of the present disclosure.

FIG. 4 illustrates a process of updating gain according to an embodiment of the present disclosure.

Referring to FIG. 4, in step 410, a terminal measures power.

In step 420, the terminal calculates a gain. For example, a power detector of the terminal measures power in a section ($N_{AGC}$) where power is received, and an AGC loop controller calculates a gain appropriate for the size of reception power, using the reception power measured by the power detector.

In step 430, the terminal updates the gain until the number of gain updates repeated satisfies a set update iteration number (MAX_ITER_NUM).

Figure 5:
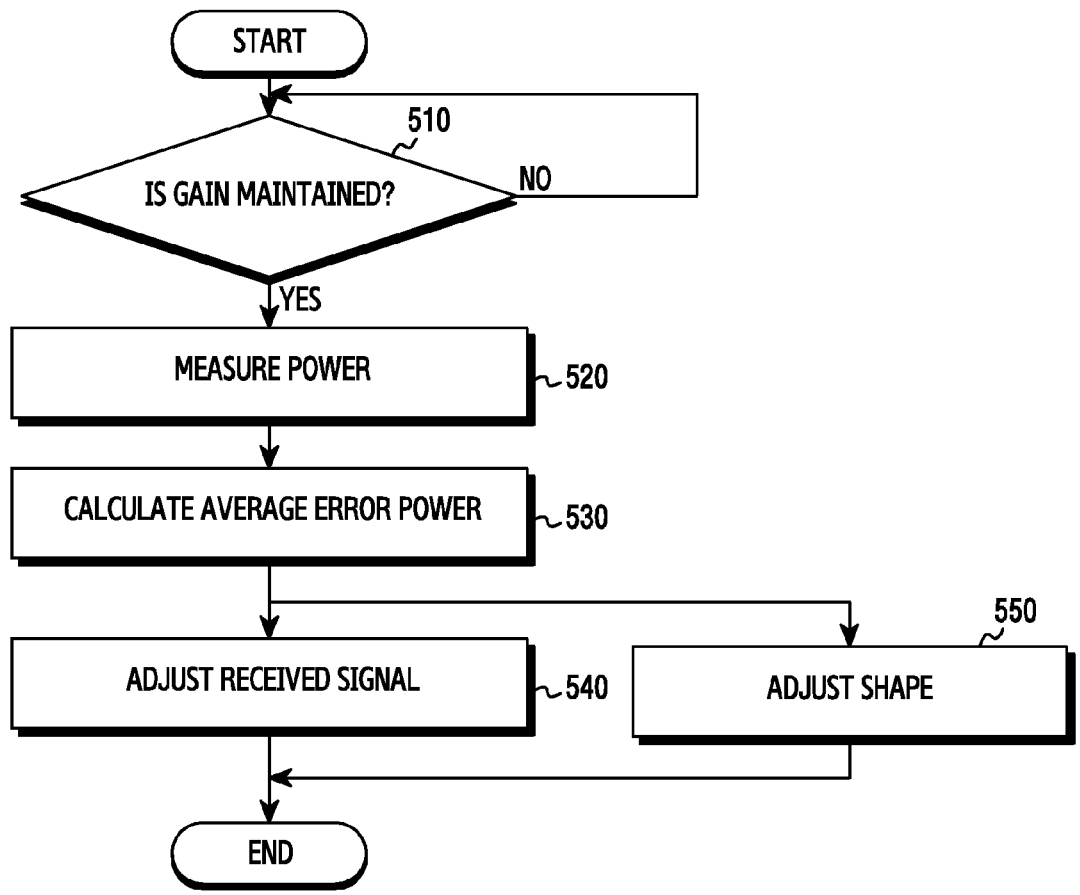
FIG. 5 illustrates a process of adjusting gain according to an embodiment of the present disclosure.

FIG. 5 illustrates a process of adjusting gain according to an embodiment of the present disclosure.

Referring to FIG. 5, in step 510, a terminal verifies whether a gain is maintained. For example, the terminal may verify that the gain is maintained, when the gain is maintained for a set gain updating iteration number (MAX_ITER_NUM).

When the gain is maintained, in step 520, the terminal measures an average power of a time slot during a predetermined period of time. For example, the predetermined period of time may start at a point where gain updating of the last iteration (MAX_ITER_NUM) begins and end at a starting point of a mid-amble.

In step 530, the terminal calculates an average error power (Pe), based on a difference between a target power and the average power measured in step 520.

In step 540, the terminal adjusts a received signal. The terminal adjusts a received signal using a sum ($E_N$) of an average error power and a value obtained by calculating a difference between a gain value ($G_{MAX\_ITER\_NUM}$) of which final updating is completed and each updated gain segment ($G_N$), e.g., $G_1$ and $G_2$ illustrated in FIG. 2. $E_N$ may be determined using Equation (3), as shown below.

$$E_N = G_{MAX\_ITER\_NUM} - G_N \qquad (3)$$

Adjustment (GainCompensation) of a received signal using $E_N$ may be performed using Equation (4), as shown below.

$$\text{GainCompensation} = Pe + E_N \qquad (4)$$

In step 550, as an alternative, the terminal adjusts the shape of the gain to a certain shape. For example, the terminal may execute adjustment by removing a discontinuous gain.

As described above, a constant gain that is applied in an amplifier passes through various filters until it arrives at a time slot buffer, and thus, when a gain adjusting unit adjusts a gain through shape adjustment corresponding to all filter responses, more accurate gain adjustment may be achieved with respect to all received signals. Accordingly, a shape adjusting unit may estimate an overall response of the filters through adjustment, and apply the value to a corresponding block, e.g., using software.

Figure 6:
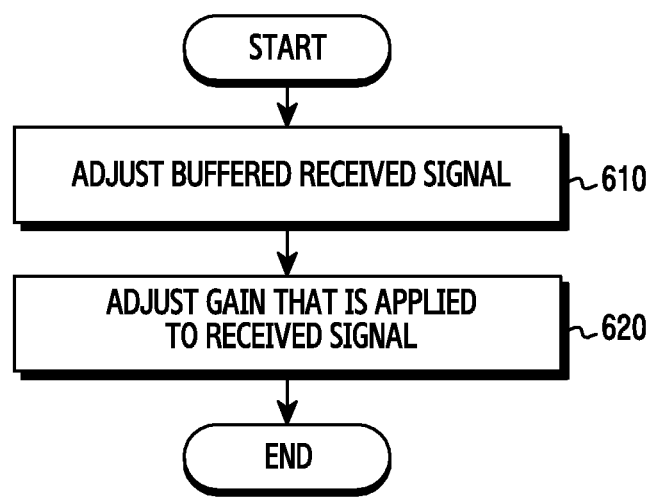
FIG. 6 illustrates a process of adjusting gain according to an embodiment of the present disclosure.

FIG. 6 illustrates a process of adjusting gain according to an embodiment of the present disclosure.

Referring to FIG. 6, in step 610, a terminal adjusts a received signal. The terminal determines an average power in a predetermined section of a received signal, determines an average error power based on a difference between a target power and the average power, ands add the average error power to a received signal, thereby adjust the received signal.

In step 620, the terminal adjusts gain information that is applied to the received signal. For example, the terminal obtains, from an AGC loop controller, information associated with a signal to which a gain is applied by an amplifier. The terminal may determine an adjustment value based on a sum of a difference between a target power and an average power of a set section and a difference between the last gain and a gain of each section, and adjust a gain of each section based on the determined adjustment value.

Figure 7:
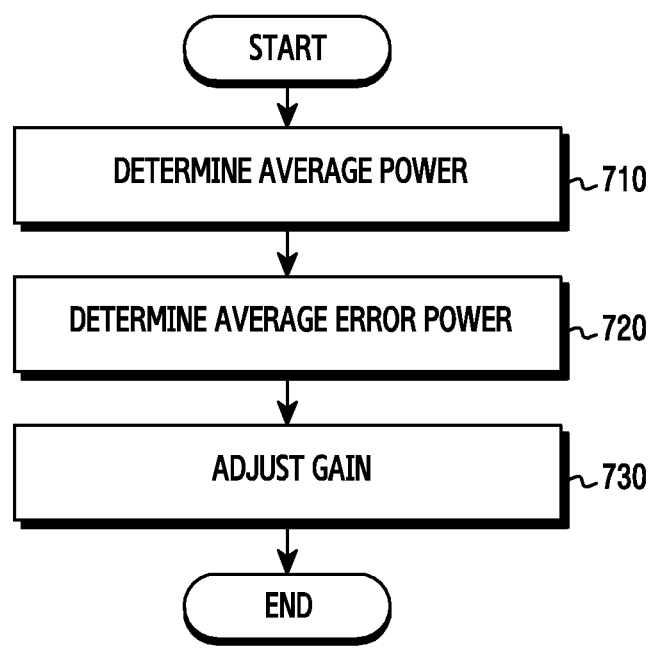
FIG. 7 illustrates a process of controlling a gain of an initial data symbol according to an embodiment of the present disclosure.

FIG. 7 illustrates a process of controlling a gain of an initial data symbol according to an embodiment of the present disclosure.

Referring to FIG. 7, in step 710, a terminal determines an average power. For example, the terminal determines the average power from a power obtained in a measurement section from where a last gain is applied in a data symbol to before a mid-amble of a time slot is buffered.

In step 720, the terminal determines an average error power. For example, the terminal determines the average error power from a difference between a predetermined target power and the average power.

In step 730, the terminal adjusts the gain. For example, the terminal determines the gain compensation by adding the average error power to power received over the entire time slot, e.g., as shown in Equation (4) above.

Figure 8:
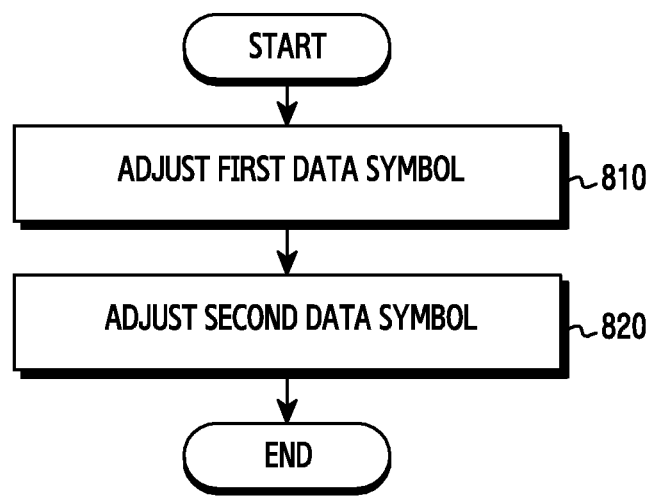
FIG. 8 illustrates a process of controlling a gain in a time slot according to an embodiment of the present disclosure.

FIG. 8 illustrates a process of controlling a gain in a time slot according to an embodiment of the present disclosure.

Referring to FIG. 8, in step 810, the terminal adjusts a first data symbol. For example, as illustrated in FIGS. 3, 4, 5, 6, and 7, the terminal measures an average power of a predetermined section, determines an average error power using a measured average power and a target power, determines a gain difference between the last gain and a gain of each section, and adds the average error power and the gain difference to each gain section, in order to adjust power.

In step 820, the terminal adjusts a second data symbol.

After the terminal adjusts the power in operation 810, and the adjustment of the second data symbol is optional.

Alternatively, the terminal may omit adjustment of the first data symbol and only adjust the second data symbol.

Figure 9:
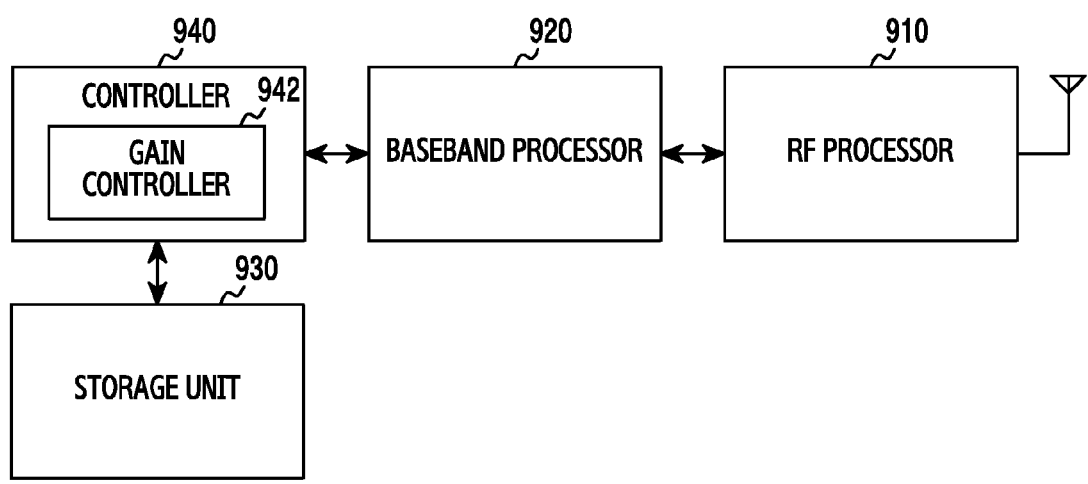
FIG. 9 is a block diagram illustrating a terminal according to an embodiment of the present disclosure.

FIG. 9 is a block diagram illustrating a terminal according to an embodiment of the present disclosure.

Referring to FIG. 9, the terminal includes a Radio Frequency (RF) processor 910, a baseband processor 920, a storage unit 930, a controller 940, and a gain controller 942.

The RF processor 910 executes functions for transmission and reception of signals through a wireless channel, such as band conversion of a signal, amplification, etc. For example, the RF processor 910 up-converts a baseband signal provided from the baseband processor 920 into an RF band signal, transmits the RF band signal via an antenna, and down-converts the RF band signal received via the antenna into a baseband signal. The RF processor 910 may include a transmission filter, a reception filter, an amplifier, a mixer, an oscillator, a Digital to Analog convertor (DAC), an Analog to Digital Convertor (ADC), etc.

Although FIG. 9 illustrates a single antenna, the terminal may include a plurality of antennas.

The baseband processor 920 executes functions for converting between a baseband signal and a bit stream, e.g., based on a physical layer standard of a system. When data is transmitted, the baseband processor 920 encodes and modulates a transmission bit stream, in order to generate complex symbols. When data is received, the baseband processor 920 restores a received bit stream by demodulating and decoding a baseband signal provided from the RF processor 910.

For example, according to an Orthogonal Frequency Division Multiplexing (OFDM) scheme, when data is transmitted, the baseband processor 920 generates complex symbols by encoding and modulating a transmitted bit stream, maps the complex symbols onto sub-carriers, and configures OFDM symbols through an Inverse Fast Fourier Transform (IFFT) operation and Cyclic Prefix (CP) insertion. When data is received, the baseband processor 920 divides a baseband signal provided from the RF processor 910 based on an OFDM symbol unit, restores signals mapped onto the sub-carriers through the FFT operation, and restores a received bit stream through demodulation and decoding.

The baseband processor 920 and the RF processor 910 transmit and receive a signal, as described above. Accordingly, the baseband processor 920 and the RF processor 910 may also be collectively referred to as a transferring unit, a transmitting unit, a receiving unit, a transceiving unit, a communication unit, a transceiver, etc. Particularly, the communication unit according to an embodiment of the present disclosure may transmit Channel Quality Indicator (CQI) information.

The storage unit 930, e.g., a memory device, stores data, such basic programs, application programs, configuration information, etc., used for operating the terminal for selecting a CQI. Particularly, the storage unit 930 may store information associated with gain control, and may store information associated with a reception failure rate. The storage unit 930 may provide stored data in response to a request of the controller 940.

The controller 940 controls general operations of the terminal for gain control. For example, the controller 940 transmits and receives a signal through the baseband processor 920 and the RF processor 910. Also, the controller 940 writes and reads data on/from the storage unit 930.

As illustrated in FIG. 9, the controller 940 may include the gain controller 942. For example, the gain controller 942 may control the terminal for gain control to execute the procedures illustrated in FIGS. 3, 4, 5, 6, 7, and 8.

Alternatively, the gain controller 942 may be embodied as a separate controller from the controller 940, or the controller 940 itself could provide all of the functionality provided by the gain controller 942.

The controller 940 determines, as an average power, power obtained in a section where the last gain is applied in a data symbol before a mid-amble of a time slot is buffered, determines a difference between a predetermined target power and the average power as an average error power, and determines an output power by adding the average error power to power received over the entire section of the time slot.

Methods stated in claims and/or specification according to various embodiments described herein may be implemented by hardware, software, or a combination of hardware and software.

In a software implementation, a computer-readable storage medium may be provided for storing one or more programs (software modules). The one or more programs stored in the computer-readable storage medium may be configured for execution by one or more processors within an electronic device, such a terminal. The one or more programs include instructions that cause the electronic device to perform the methods according to embodiments disclosed herein or in the appended claims.

The programs (software modules or software) may be stored in non-volatile memories including a random access memory and a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs), or other type optical storage devices, or a magnetic cassette. Alternatively, any combination of some or all of the may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

Although certain embodiments have been described above in the detailed description of the present disclosure, the present disclosure may be modified in various forms without departing from the scope of the present disclosure. Therefore, the scope of the present disclosure should not be defined as being limited to the embodiments, but should be defined by the appended claims and equivalents thereof.

What is claimed is:

1. A method of a terminal in a communication system, the method comprising:
   determining an average power from power obtained in a measurement section of a data symbol in a time slot including an updated gain section and a maintained gain section, the measurement section starting after a last gain is applied in the data symbol and ending before a mid-amble of the time slot is buffered;
   determining an average error power from a difference between a predetermined target power and the average power; and
   determining an output power by adding the average error power to power that is received over the time slot.

2. The method of claim 1, wherein determining the output power further comprises adding, for each gain update segment included the updated gain section, a difference between the last gain applied in the data symbol and a gain of each gain update segment, to each gain update segment, respectively.

3. The method of claim 1, further comprising storing information associated with a gain that is applied to the data symbol.

4. The method of claim 1, further comprising adjusting a shape of the gain in the updated gain section.

5. The method of claim 4, wherein adjusting the shape of the gain comprises removing discontinuous gain.

6. The method of claim 1, wherein the predetermined target power is determined based on at least one of a design of a modem of the terminal, a Radio Frequency Integrated Circuit (RFIC) of the terminal, and a discontinuous Analog Digital Converter (ADC) of the terminal.

7. The method of claim 1, wherein the predetermined target power is based on a channel environment.

8. The method of claim 7, wherein the channel environment includes at least one of a size of an interference signal and a required Signal to Noise Ratio (SNR) of received data.

9. A terminal in a communication system, the terminal comprising:
   a transceiver configured to receive a signal; and
   a controller configured to
   determine an average power from power obtained in a measurement section of a data symbol in a time slot of the signal including an updated gain section and a maintained gain section, the measurement section starting after a last gain is applied in the data symbol and ending before a mid-amble of the time slot is buffered,
   determine an average error power from a difference between a predetermined target power and the average power, and
   determine an output power by adding the average error power to power that is received over the time slot.

10. The terminal of claim 9, wherein the controller is further configured to add, for each gain update segment included the updated gain section, a difference between the last gain applied in the data symbol and a gain of each gain update segment, to each gain update segment, respectively.

11. The terminal of claim 9, further comprising a storage unit that stores information associated with a gain that is applied to the data symbol.

12. The terminal of claim 9, wherein the controller is further configured to adjust a shape of the gain in the updated gain section.

13. The terminal of claim 9, wherein the controller adjusts the shape of the gain by removing discontinuous gain.

14. The terminal of claim 9, wherein the predetermined target power is determined based on at least one a design of a modem of the terminal, a Radio Frequency Integrated Circuit (RFIC) of the terminal, and a discontinuous Analog Digital Converter (ADC) of the terminal.

15. The terminal of claim 9, wherein the predetermined target power is based on a channel environment.

16. The terminal of claim 15, wherein the channel environment includes at least one of a size of an interference signal and a required Signal to Noise Ratio (SNR) of received data.

17. A chipset, configured to:
   determine an average power from power obtained in a measurement section of a data symbol in a time slot including an updated gain section and a maintained gain section, the measurement section starting after a last gain is applied in the data symbol and ending before a mid-amble of the time slot is buffered;
   determine an average error power from a difference between a predetermined target power and the average power; and
   determine an output power by adding the average error power to power that is received over the time slot.

18. The chipset of claim 17, further configured to add, for each gain update segment included the updated gain section, a difference between the last gain applied in the data symbol and a gain of each gain update segment, to each gain update segment, respectively.

19. The chipset of claim 17, further configured to store information associated with a gain that is applied to the data symbol.

20. The chipset of claim 17, further configured to adjust a shape of the gain in the updated gain section.

* * * * *